(12) United States Patent
She

(10) Patent No.: US 12,050,479 B2
(45) Date of Patent: Jul. 30, 2024

(54) VOLTAGE REGULATION FOR MULTIPLE VOLTAGE LEVELS

(71) Applicant: YANGTZE MEMORY TECHNOLOGIES CO., LTD., Wuhan (CN)

(72) Inventor: Min She, Wuhan (CN)

(73) Assignee: YANGTZE MEMORY TECHNOLOGIES CO., LTD., Wuhan (CN)

( * ) Notice: Subject to any disclaimer, the term of this patent is extended or adjusted under 35 U.S.C. 154(b) by 0 days.

(21) Appl. No.: 18/234,356

(22) Filed: Aug. 15, 2023

(65) Prior Publication Data

US 2023/0384812 A1 Nov. 30, 2023

Related U.S. Application Data

(63) Continuation of application No. 17/186,511, filed on Feb. 26, 2021, now Pat. No. 11,797,037, which is a continuation of application No. PCT/CN2020/138524, filed on Dec. 23, 2020.

(51) Int. Cl.
| | |
|---|---|
| *G11C 13/00* | (2006.01) |
| *G05F 1/575* | (2006.01) |
| *G05F 1/59* | (2006.01) |
| *G11C 16/04* | (2006.01) |
| *G11C 16/08* | (2006.01) |
| *G11C 16/24* | (2006.01) |

(52) U.S. Cl.
CPC .............. *G05F 1/575* (2013.01); *G05F 1/59* (2013.01); *G11C 16/0483* (2013.01); *G11C 16/08* (2013.01); *G11C 16/24* (2013.01); *G11C 13/00* (2013.01)

(58) Field of Classification Search
CPC .......................... G11C 13/0069; G05F 1/575
See application file for complete search history.

(56) References Cited

U.S. PATENT DOCUMENTS

| | | | |
|---|---|---|---|
| 6,114,843 A | 9/2000 | Olah | |
| 2014/0340067 A1* | 11/2014 | Zhong | G05F 1/575 323/311 |
| 2020/0194067 A1* | 6/2020 | Park | G11C 13/0069 |

FOREIGN PATENT DOCUMENTS

| | | |
|---|---|---|
| CN | 1829083 A | 9/2006 |
| CN | 101065808 A | 10/2007 |
| CN | 101196756 A | 6/2008 |

(Continued)

OTHER PUBLICATIONS

International Search Report issued in corresponding International Application No. PCT/CN2020/138524, mailed Sep. 28, 2021, 4 pages.

*Primary Examiner* — Jason Lappas
(74) *Attorney, Agent, or Firm* — BAYES PLLC

(57) ABSTRACT

A voltage regulator can include an operational amplifier powered by a supply voltage and configured to generate a first gate voltage. The voltage regulator can also include a first transistor configured to receive the first gate voltage and generate a first driving voltage. The voltage regulator can further include a second transistor configured to receive a second gate voltage and generate a second driving voltage. The first gate voltage can be generated based on feedback provided to the operational amplifier. The second gate voltage can be generated from the first gate voltage.

20 Claims, 8 Drawing Sheets

(56) References Cited

FOREIGN PATENT DOCUMENTS

| CN | 111292777 A | 6/2020 |
| CN | 111489778 A | 8/2020 |
| CN | 111781981 A | 10/2020 |

\* cited by examiner

VOLTAGE REGULATION FOR MULTIPLE VOLTAGE LEVELS

CROSS-REFERENCE TO RELATED APPLICATIONS

This application is a continuation of U.S. application Ser. No. 17/186,511, filed on Feb. 26, 2021, which is a continuation of International Application No. PCT/CN2020/138524, filed on Dec. 23, 2020, entitled "VOLTAGE REGULATION FOR MULTIPLE VOLTAGE LEVELS," both of which are hereby incorporated by reference in their entireties.

BACKGROUND

The present disclosure relates to voltage regulation for multiple voltage levels, such as for driving, for example, word lines of a memory circuit.

A voltage regulator can be used in a power supply context to provide a steady, constant voltage supply across a range of operational conditions. A voltage regulator can handle changes in load in situations where the load may change over time. A linear voltage regulator can use internal circuitry that includes a differential amplifier. The linear voltage regulator may implement a fixed output.

SUMMARY

In certain implementations of the present disclosure, a voltage regulator can include an operational amplifier powered by a supply voltage and configured to generate a first gate voltage. The voltage regulator can also include a first transistor configured to receive the first gate voltage and generate a first driving voltage. The voltage regulator can further include a second transistor configured to receive a second gate voltage and generate a second driving voltage. The first gate voltage can be generated based on feedback provided to the operational amplifier. The second gate voltage can be generated from the first gate voltage.

In certain additional implementations of the present disclosure, a method for voltage regulation can include generating a first gate voltage using power from a supply voltage. The method can also include generating a first driving voltage based on the first gate voltage. The method can further include generating a second driving voltage based on a second gate voltage. The first gate voltage can be generated based on feedback. The second gate voltage can be generated from the first gate voltage.

In certain further implementations of the present disclosure, a memory device can include an array of memory cells and a plurality of word lines connected to respective subsets of the array of memory cells. The memory device can also include a word line driving circuit connected to each of the plurality of word lines. The word line driving circuit can include an operational amplifier powered by a supply voltage and configured to generate a first gate voltage. The word line driving circuit can also include a first transistor configured to receive the first gate voltage and generate a first driving voltage. The word line driving circuit can further include a second transistor configured to receive a second gate voltage and generate a second driving voltage. The first gate voltage can be generated based on feedback provided to the operational amplifier. The second gate voltage can be generated from the first gate voltage. The first driving voltage can be configured to drive a first word line of the plurality of word lines. The second driving voltage can be configured to drive a second word line of the plurality of word lines.

BRIEF DESCRIPTION OF THE DRAWINGS

The accompanying drawings, which are incorporated herein and form a part of the specification, illustrate implementations of the present disclosure and, together with the description, further serve to explain the present disclosure and to enable a person skilled in the pertinent art to make and use the present disclosure.

Figure 1:
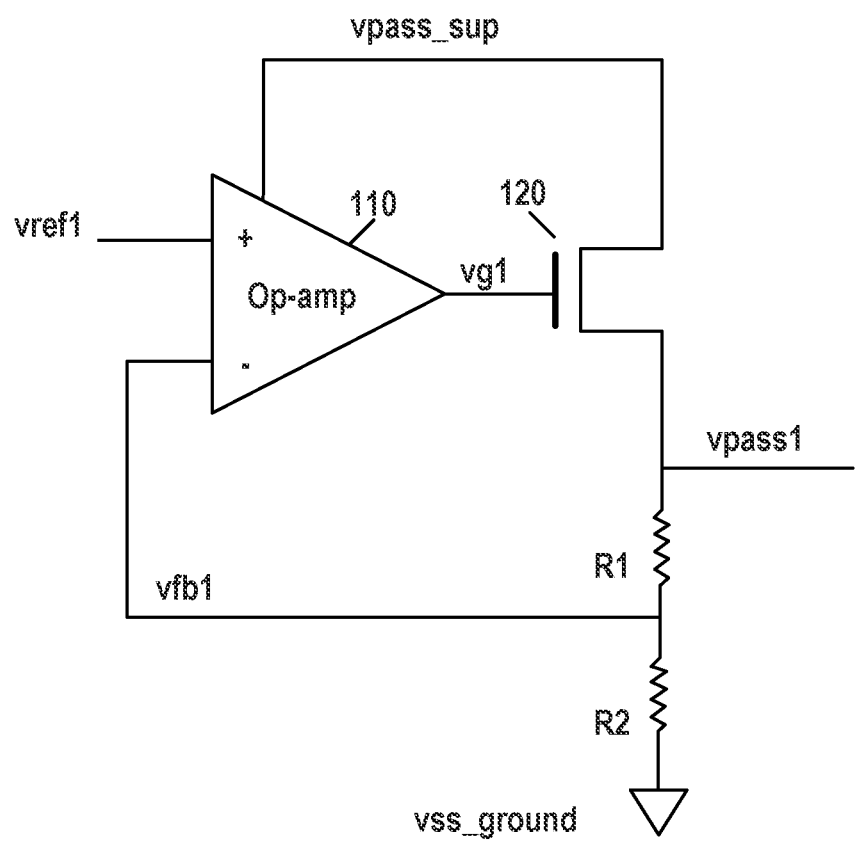
FIG. 1 illustrates a voltage regulator circuit.

Implementations of the present disclosure will be described with reference to the accompanying drawings.

DETAILED DESCRIPTION

Although specific configurations and arrangements are discussed, it should be understood that this is done for illustrative purposes only. As such, other configurations and arrangements can be used without departing from the scope of the present disclosure. Also, the present disclosure can also be employed in a variety of other applications. Functional and structural features as described in the present disclosures can be combined, adjusted, and modified with one another and in ways not specifically depicted in the drawings, such that these combinations, adjustments, and modifications are within the scope of the present discloses.

In general, terminology may be understood at least in part from usage in context. For example, the term "one or more" as used herein, depending at least in part upon context, may be used to describe any feature, structure, or characteristic in a singular sense or may be used to describe combinations of features, structures or characteristics in a plural sense. Similarly, terms, such as "a," "an," or "the," again, may be understood to convey a singular usage or to convey a plural usage, depending at least in part upon context. In addition, the term "based on" may be understood as not necessarily intended to convey an exclusive set of factors and may, instead, allow for existence of additional factors not necessarily expressly described, again, depending at least in part on context.

FIG. 1 illustrates a voltage regulator circuit. As shown in FIG. 1, voltage regulator circuit 100 may include an operational amplifier (op-amp) 110. Op-amp 110 may drive gate
} voltage vg1 of a transistor 120. Transistor 120 may be a metal-oxide-semiconductor field-effect transistor (MOSFET) operated in Ohmic mode or in active mode. MOSFET and some other transistors may have multiple modes of operation. When there is no voltage applied to a gate of the transistor, the transistor may block conduction from source to drain. In saturation or active mode, the transistor may provide a drain current that is mainly controlled by the gate-source voltage. In Ohmic mode, also known as triode mode or the linear region, a transistor can act as a resistor controlled by the gate voltage relative to the source and drain voltages.

Power supply voltage vpass_sup can be provided to op-amp 110 and transistor 120. Gate voltage vg1 can control the amount of current through transistor 120 and consequently can control output voltage vpass1. Output voltage vpass1 may also be determined by the values of resistors R1 and R2. Resistors R1 and R2 may form a voltage divider from vpass1 to ground vss_ground to provide feedback voltage vfb1 to the negative input of op-amp 110. The positive input of op-amp 110 may be supplied by reference voltage vref1.

In the memory chips, a large number of voltage sources are used to bias word lines. For example, for 3D NAND memory devices having over 90 levels, up to 90 different voltages sources, for example 20 voltages sources, could be needed to bias all the word lines. FIG. 1 illustrates a voltage source for outputting a single bias voltage vpass1. Typical voltage values may range from 2V to 12V. There may be similar voltage sources, each with their own dedicated regulator and dedicated op-amp, for outputting other bias voltages vpass2, vpass3, and so on up to the total number, n, with vpassn. When n is large, the result may be a large number of relatively large op-amps. These large op-amps may take up area on the die and may also consume power. The op-amp may also need other power supply, such as vdd or the like. Thus, for an increasingly large number of desired voltage levels on a chip, the number of large, power-consuming op-amps may also increase.

To address or alleviate the aforementioned issues, the present disclosure introduces a solution that may provide a larger number of voltage levels using a smaller number of voltage regulators with a large and dedicated op-amp. Thus, in certain implementations, the present disclosure may reduce power consumption and reduce the design area of a chip.

Figure 2:
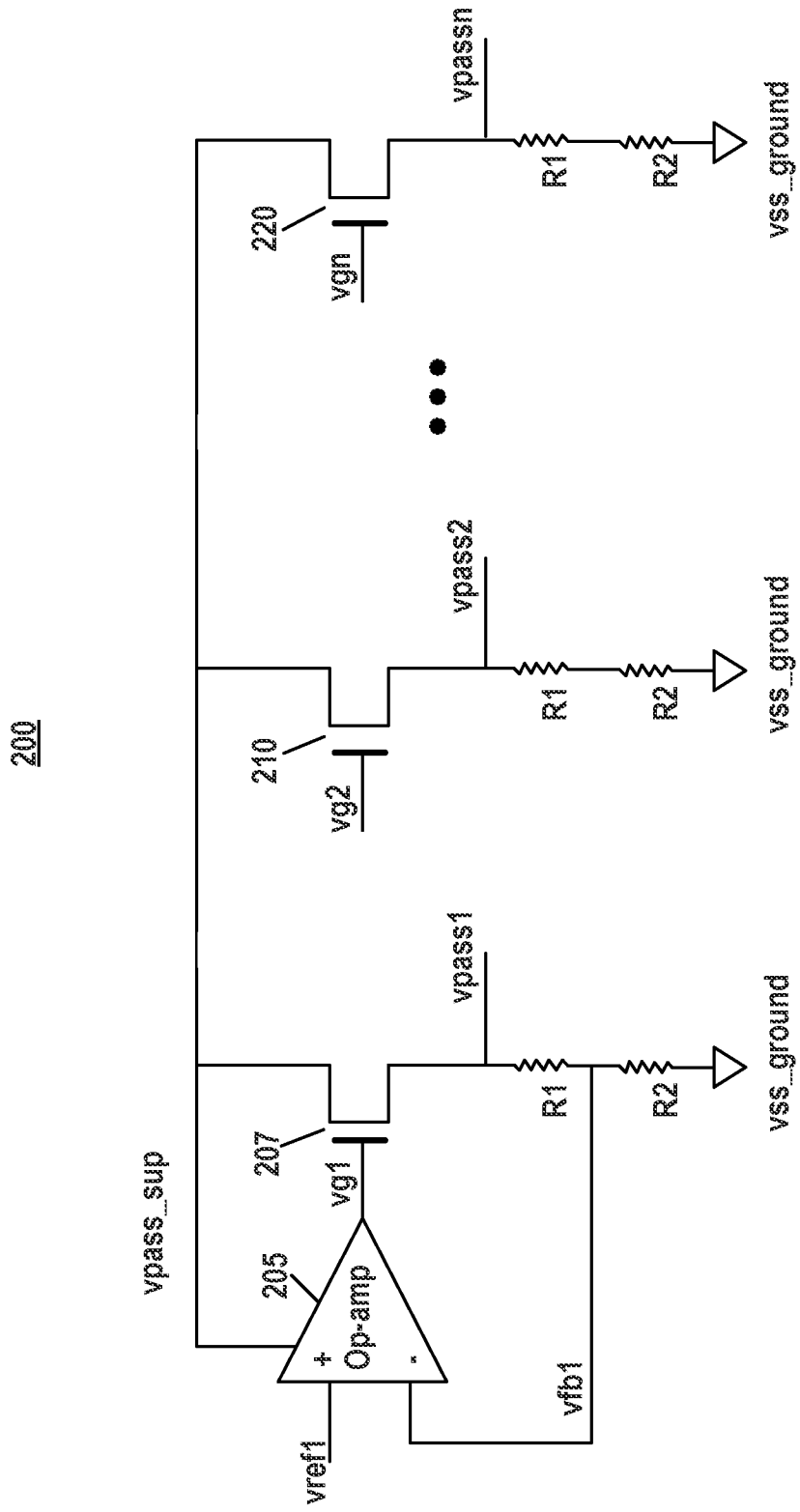
FIG. 2 illustrates a circuit diagram of an exemplary voltage regulator circuit, according to certain implementations of the present disclosure.

FIG. 2 illustrates a circuit diagram of an exemplary voltage regulator circuit 200, according to certain implementations of the present disclosure. As shown in FIG. 2, a first portion of circuit 200, configured to generate vpass1, may resemble the circuit shown in FIG. 1. In addition, however, there may be further branches of circuit 200 configured to generate vpass2, vpass3, and so on to vpassn. vpass2 to vpassn can have different voltage levels and could be used as voltage sources with different voltage levels for driving word lines.

Circuit 200 may be driven by one feedback controlled large op-amp 205. In addition to transistor 207 configured to control current to provide vpass1, there may be further transistors 210 and 220 to control respective currents to provide vpass2, vpassn, and the like. Each vpass value may have its own respective transistor and may provide its own respective vpass output voltage. Each transistor in circuit 200 may be controlled by a respective gate voltage (for example, vg1, vg2 . . . vgn) to yield respective output voltage (for example, vpass1, vpass 2 . . . vpassn). As vpass1, vpass2, and so on, may each be different from one another, and as each transistor may be similarly constructed and operating in an active mode, the respective gate voltages may need to be different from one another as well.

Each branch of circuit 200 is shown having a pair of resistors R1, R2. The use of similar resistors or resistive elements may be useful for constructing a circuit with predictable behavior, even though only one pair may provide feedback to op-amp 205. The resistor pairs R1, R2 for each branch may be matched with those of each of the other branches. There are a number of alternatives to providing resistor pairs, with one possible implementation shown in FIG. 3, discussed below.

As mentioned above, each of the gate voltages for a corresponding transistor in each branch of circuit 200 may be different from one another. There are a number of ways that these voltages can be generated, with one example for such generation being illustrated in FIG. 4.

Figure 3:
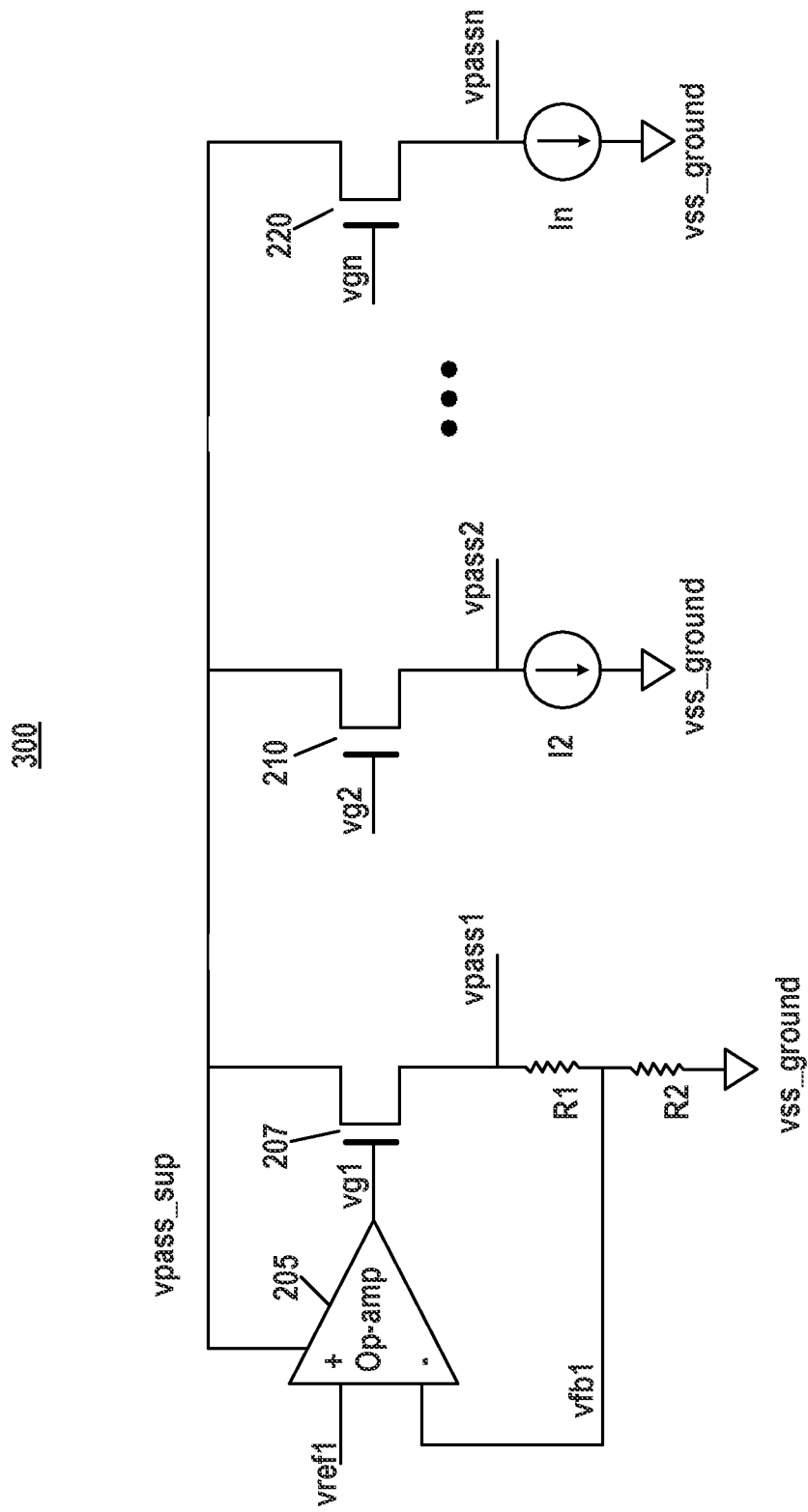
FIG. 3 illustrates a circuit diagram of another exemplary voltage regulator circuit, according to certain implementations of the present disclosure.
Figure 5:
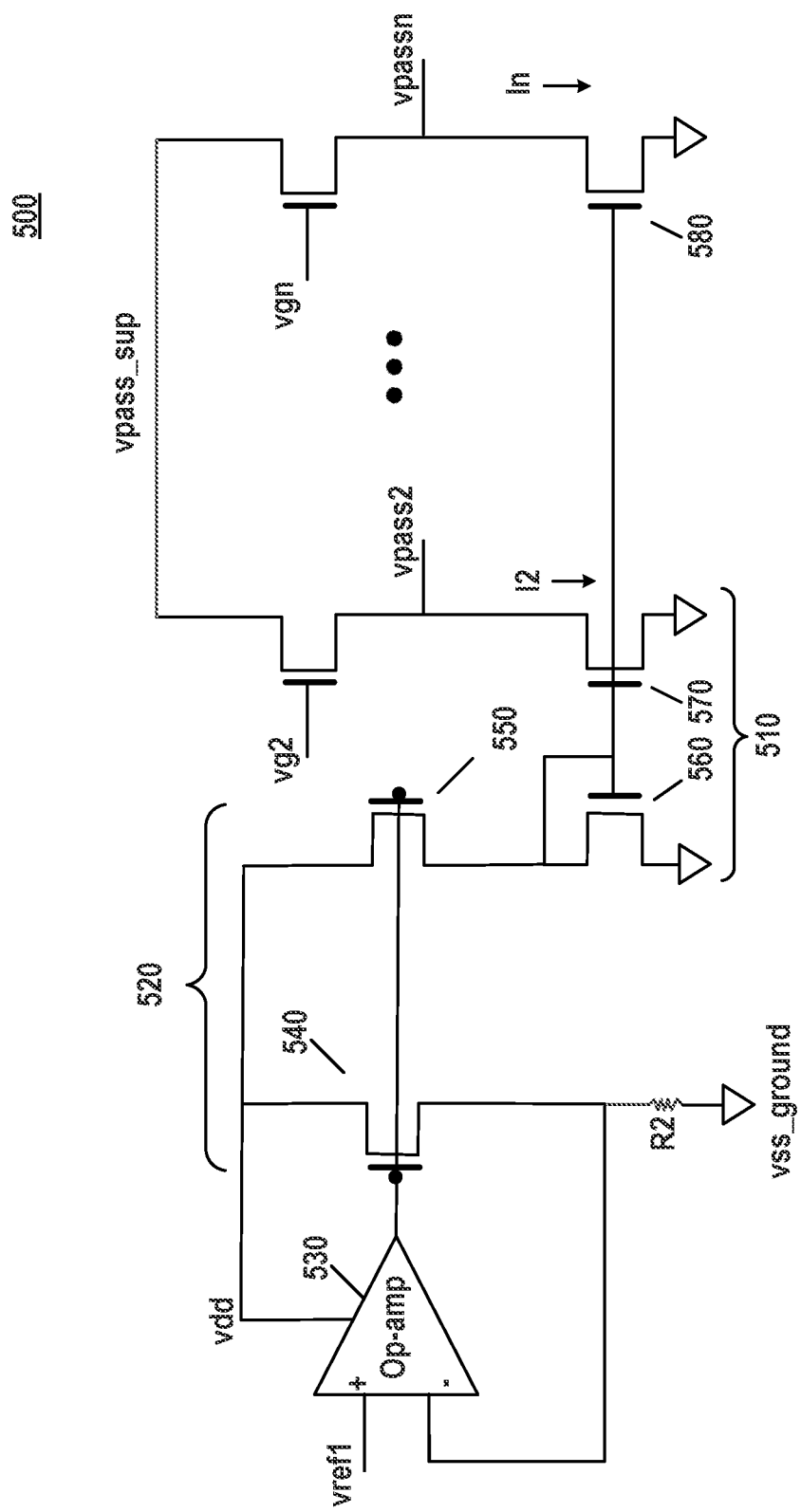
FIG. 5 illustrates a circuit diagram of an exemplary current source, according to certain implementations of the present disclosure.
Figure 6:
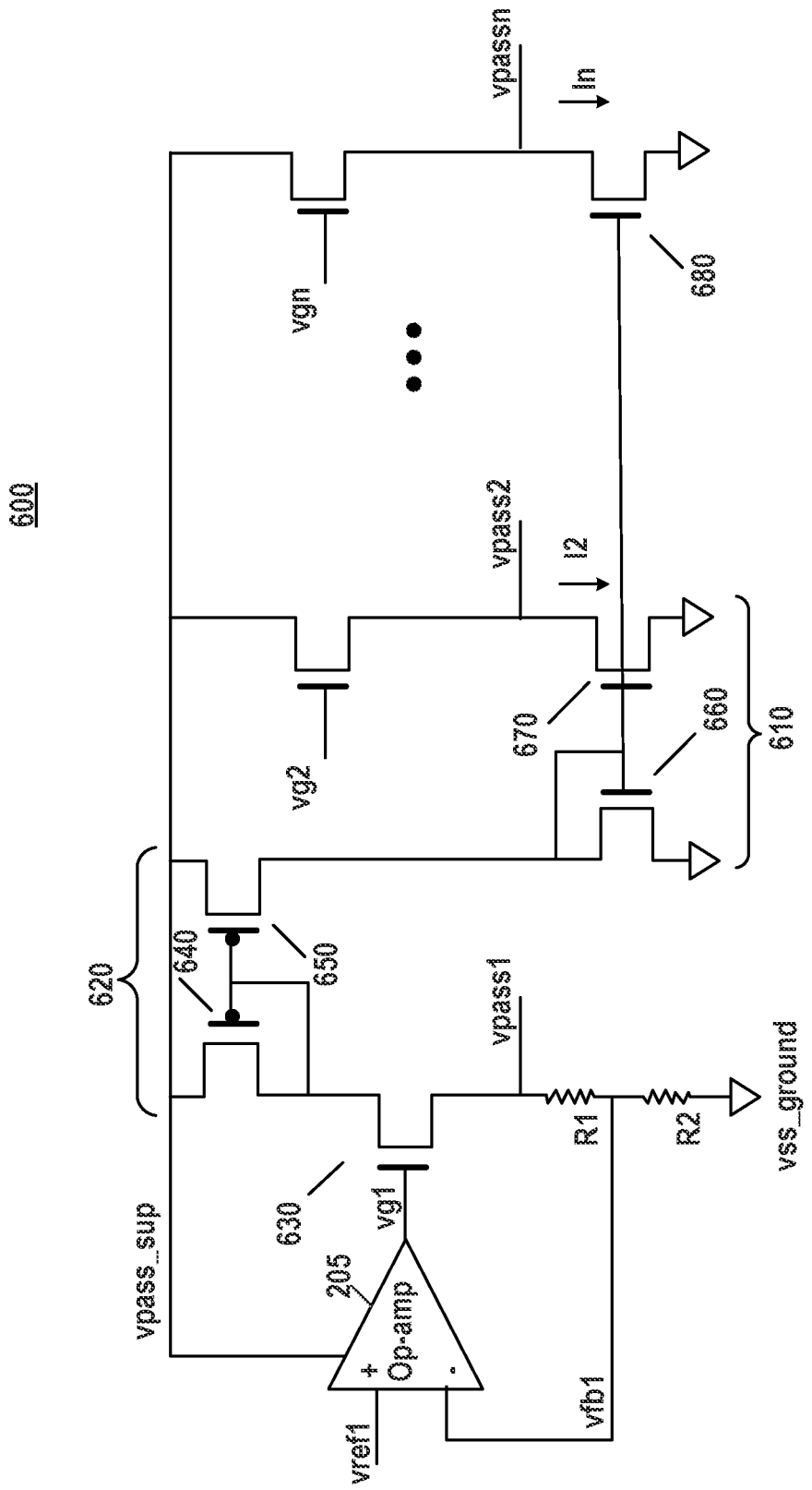
FIG. 6 illustrates a circuit diagram of another exemplary current source, according to certain implementations of the present disclosure.

FIG. 3 illustrates a circuit diagram of another exemplary voltage regulator circuit 300, according to certain implementations of the present disclosure. Circuit 300 of FIG. 3 may be different from circuit 200 of FIG. 2 in that the resistor pairs other than those used for feedback may be replaced with current sources, I2 to In. Examples of possible current sources are illustrated in FIGS. 5 and 6.

Current sources I2 through In may be identical to one another. Other ways of driving the current aside from resistor pairs and current sources are also possible. Thus, the approach shown in FIGS. 2 and 3 can be considered two examples of a more general approach. The more general approach may rely on driving a reference voltage using feedback control and driving other voltages based on a predetermined relationship between the reference voltage and the other voltages. In this case, the reference voltage may be the first output voltage, vpass1.

Figure 4:
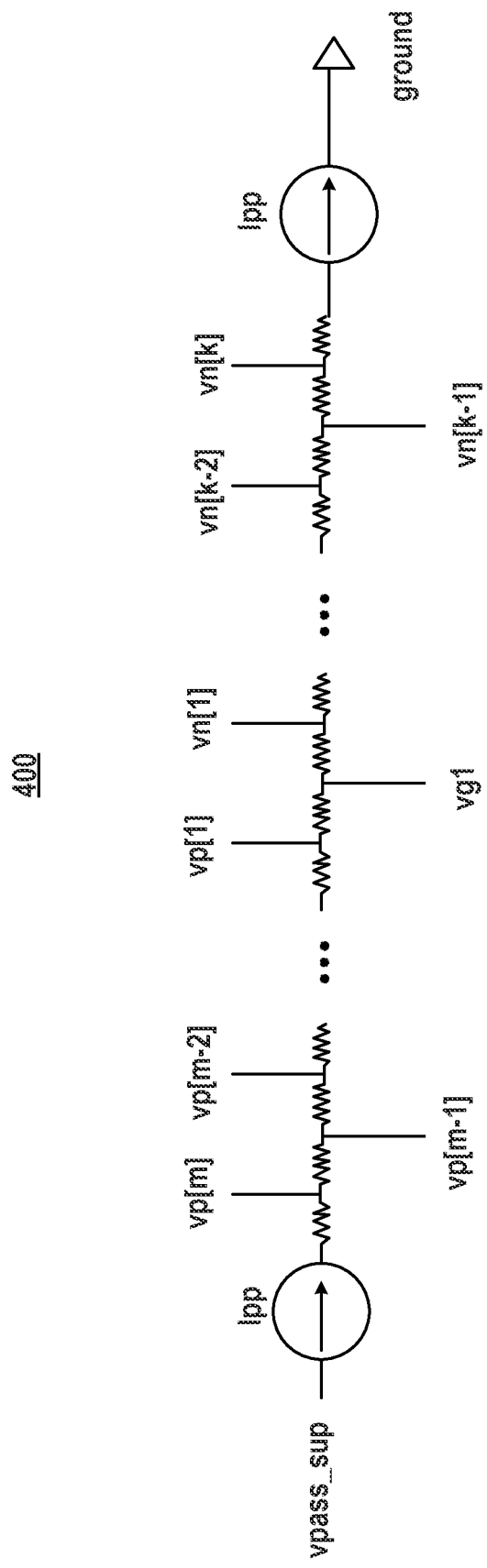
FIG. 4 illustrates a circuit diagram of an exemplary voltage supply according to certain implementations of the present disclosure.

FIG. 4 illustrates a circuit diagram of an exemplary voltage supply, according to certain implementations of the present disclosure. As shown in FIG. 4, there can be a reference voltage (for example, vg1) that may be controlled by a voltage regulator, such as shown in FIG. 2 or FIG. 3.

The diagram in FIG. 4 illustrates one way to generate different gate voltage levels, which can control the gate of a MOSFET to generate different voltage sources vpass2 to vpassn. As shown in FIG. 4, circuit 400 may be a current source powered voltage divider between vpass_sup and ground, such as vss_ground shown in FIGS. 1, 2, and 3.

The current sources Ipp may maintain a current through a series of resistors. Although a single linear chain of resistors is shown, resistors in parallel with one another may be substituted for a single resistor in the chain, or other resistive elements may replace the resistors. Other modifications are also possible.

The value of vg1 may be determined by a voltage regulator, such as circuit 200 or circuit 300 shown respectively in FIGS. 2 and 3. The remaining voltages may then be determined based on voltage division across the resistor network.

In FIG. 4, voltages above vg1 can be referred to as vp[1], vp[2], and so on up to vp[m]. Thus, the final three voltages on the left side of the network are designated vp[m], vp[m-1], and vp[m-2], respectively. Similarly, the voltages below vg1 can referred to as vn[1], vn[2], and so on down to vn[k]. Thus, the final three voltages on the right side of the network are designated vn[k-2], vn[k-1], and vn[k], respectively.

In certain implementations, each resistor in the network has the same resistance. Accordingly, the voltage at each adjacent node of the network may be a controlled amount of voltage different from the respective neighboring nodes. For example, vp[m-1] may be 100 millivolts (mV) less than vp[m] and 100 mV more than vp[m-2].

Ipp current can be injected into this resistor chain (for example, from a PMOS current mirror, not shown) and can be sunk to the ground (for example, through an NMOS current mirror, also not shown).

Uniform voltage steps can be realized by the use of a series of identical or nearly identical resistors. For example, if every step is chosen to be 100 mV, then vp[1]=vg1+100 mV, vp[2]=vg1+2*100 mV, and so on. Likewise, with voltage steps of 100 mV, vn[1]=vg1−100 mv, vn[2]=vg1−2*100 mV, and so on.

Gate voltages can be selected from the nodes of the resistive network. For example, vg2 in FIGS. 2 and 3 can be selected from any of vp[1:m] or vn[1:k]voltage level to obtain a desired vpass2 voltage. For example, if vpass2 requires a gate voltage 500 mV higher than vpass1 and 100 mV steps are used, vp[5] can be used for vg2. On the other hand, if vpass2 requires a gate voltage 500 mV lower than the vpass1 and 100 mV steps are used, then vg2 can choose vn[5]. Switches or the like can be used to connect the appropriate node to the appropriate gate of the respective transistor. The other vpass voltage sources can be obtained in a similar way.

FIG. 5 illustrates a circuit diagram of an exemplary current source, according to certain implementations of the present disclosure. The diagram in FIG. 5 illustrates one non-limiting way to generate current sources shown in FIG. 3.

In this approach, NMOS current mirrors 510 and PMOS current mirrors 520 can be used to generate current sources I2 to In, which can be used to obtain the voltage sources of vpass2 to vpassn in combination with gate voltages vg2 to vgn.

For example, as shown in FIG. 5, the gates of transistors 540 and 550 can be controlled by the output of op-amp 530. Thus, the current through transistor 540 can be equal to vref1 divided by R2, the current through 550 is determined by the mirror size ratio between the transistor 550 and the transistor 540, and the current through transistor 560 is equal to the current through 550. Moreover, the current I2 through transistor 570 can be determined by the mirror size ratio between transistor 570 and transistor 560, and the current In through transistor 580 can be determined by the mirror size ratio between transistor 580 and transistor 560. Thus, currents I2 to In can be controlled by op-amp 530.

Op-amp 530 may be a different design from op-amp 110 in FIG. 1 or op-amp 205 in FIG. 2. Op-amp 530 may be used to generate the current source for circuit 500. The power supply of op-amp 530 could be vdd, which may be different from vpass_sup. The voltage of the power supply, vdd, can be a low voltage supply, such as around 2V or even lower. Op-amp 530 may not require high bandwidth and may be realized with a small area and small power consumption.

FIG. 6 illustrates a circuit diagram of another exemplary current source, according to certain implementations of the present disclosure. The diagram in FIG. 6 illustrates another way to generate the current sources shown in FIG. 3. This approach can re-utilize the same op-amp 205, which regulates the vpass1. Thus, in a sense, the entire circuit 600 may be driven by a single, same op-amp 205, in combination with supply voltage, vpass_sup.

In this approach, NMOS current mirror 610 and PMOS current mirror 620 can be used to generate current sources I2 to In, which can be used to obtain the voltage sources of vpass2 to vpassn in combination with gate voltages vg2 to vgn.

For example, in certain implementations, the drain voltage of transistor 630 can be the gate voltages of transistors 640 and 650 of PMOS current mirror 620, as well as the drain voltage of transistor 640. Thus, the current through transistor 640 is equal to vref1 divided by R2, since vfb1=vref1; the current through transistor 650 is determined by the mirror size ratio between the transistor 650 and the transistor 640. Moreover, the drain voltage of transistor 650 can be the drain voltage of transistor 660, as well as the common gate voltage of transistors 660, 670, and 680. Thus op-amp 205 can provide the driving power for transistors 660, 670, and 680 in combination with supply voltage, vpass_sup. Other current sources are also permitted, with the approaches FIGS. 5 and 6 merely serving as illustrations.

Figure 7:
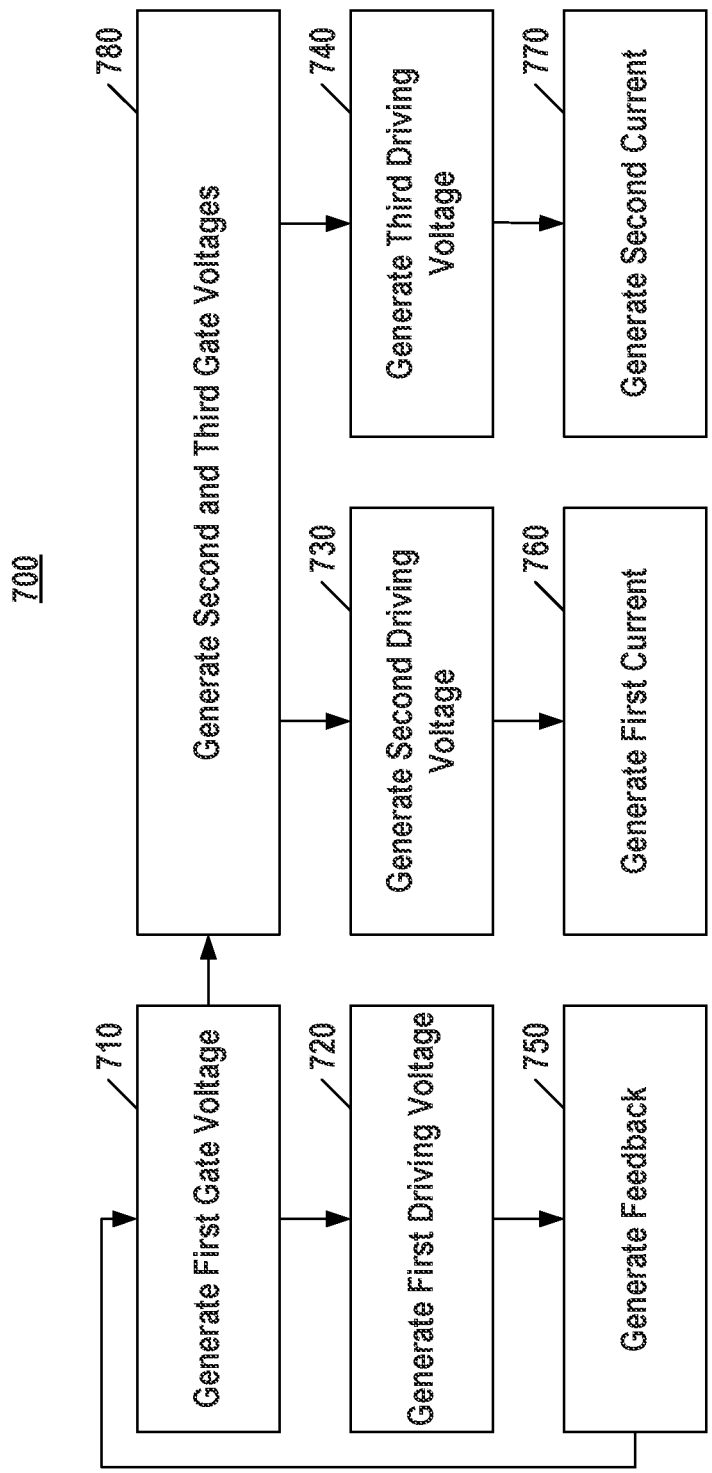
FIG. 7 illustrates a flow chart of an exemplary method for voltage regulation, according to certain implementations of the present disclosure.

FIG. 7 illustrates a flow chart of an exemplary method 700 for voltage regulation, according to certain implementations of the present disclosure. It is understood that the operations shown in method 700 are not exhaustive and that other operations can be performed as well before, after, or between any of the illustrated operations. Further, some of the operations may be performed simultaneously, or in a different order than shown in FIG. 7.

Method 700 can include, at 710, generating a first gate voltage using power from a supply voltage. Method 700 can also include, at 720, generating a first driving voltage based on the first gate voltage. Method 700 can further include, at 730, generating a second driving voltage based on a second gate voltage. Method 700 can further include, at 740, generating a third driving voltage based on a third gate voltage.

The first gate voltage can be generated based on feedback, as illustrated, for example, in FIGS. 2 and 3. The second gate voltage and third gate voltage can be generated from the first gate voltage, as illustrated, for example, FIG. 4.

As shown in FIG. 7, method 700 can also include, at 750, generating the feedback using a first resistor pair connected between the first driving voltage and ground. This may be performed using the left-most resistor pair in FIG. 2 or the similar resistor pair R1, R2 in FIG. 3.

As shown in FIG. 7, method 700 can further include, at 760, generating a first current. This may be performed using a second resistor pair connected between the second driving voltage and ground, as illustrated in FIG. 2, or using a first current source connected between the second driving voltage and ground as illustrated in FIG. 3.

As shown in FIG. 7, method 700 can additionally include, at 770, generating a second current. This may be performed using a third resistor pair connected between the third driving voltage and ground, as illustrated in FIG. 2, or using a second current source connected between the third driving voltage and ground, as illustrated in FIG. 3. Other implementations of generating the first and second currents are also permitted. The generation of the first current and the generation of the second current can be performed by a same driving operational amplifier, as illustrated in FIGS. 5 and 6. As illustrated in FIG. 6, the same operational amplifier can further generate the first gate voltage.

As illustrated in FIGS. 5 and 6, the first current source and the second current source comprise a PMOS current mirror and an NMOS current mirror.

As shown in FIG. 7, method 700 can further include, at 780, generating the second gate voltage and the third gate voltage from the first gate voltage, using a resistor network connected between the supply voltage and ground. Such generation using a resistor network is illustrated, by way of example, in FIG. 4. As shown in FIG. 4, the resistor network can include a series of identical resistors. The second gate voltage can be drawn from between a first pair of the identical resistors, and the third gate voltage can be drawn from between a second pair of the identical resistors. The resistor network can include a pair of current sources in series with the series of identical resistors and can be configured to provide current to the resistor network. The series of identical resistors can be connected or biased between the supply voltage and the ground.

Figure 8:
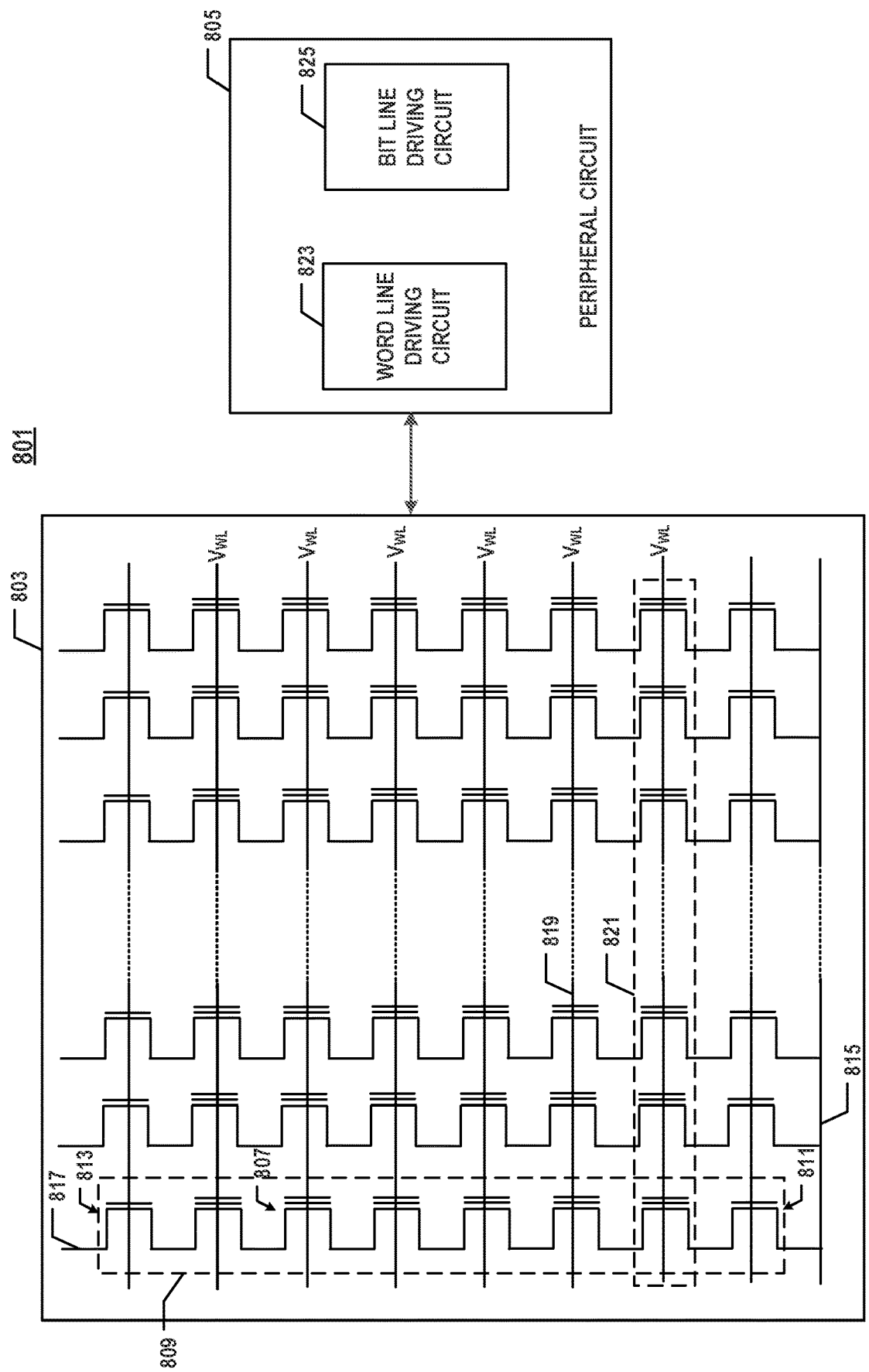
FIG. 8 illustrates a diagram of an exemplary three-dimensional (3 D) memory device, according to some implementations of the present disclosure.

The voltage regulators for voltage regulation with multiple voltage levels disclosed herein may be implemented as part of a word line driving circuit of a peripheral circuit of a 3D NAND memory device, which requires a large number of gradually changed word line bias voltage levels for different word lines. FIG. 8 illustrates a diagram of an exemplary 3D memory device 801, according to some implementations of the present disclosure. 3D memory device 801 can include a memory array device 803 and a peripheral circuit 805 connected to memory array device 803. Memory array device 803 can be a 3D NAND Flash memory device in which memory cells 807 are provided in the form of an array of NAND memory strings 809 each extending vertically above a substrate (not shown). In some implementations, each NAND memory string 809 includes a plurality of memory cells 807 connected in series and stacked vertically. Each memory cell 807 can hold a continuous, analog value, such as an electrical voltage or charge, that depends on a number of electrons trapped within a region of memory cell 807. Each memory cell 807 can be either a "floating gate" type of memory cell including a floating-gate transistor or a "charge trap" type of memory cell including a charge-trap transistor.

In some implementations, each memory cell 807 is a single-level cell (SLC) that has two possible memory states and thus, can store one bit of data. For example, the first memory state "0" can correspond to a first range of voltages, and the second memory state "1" can correspond to a second range of voltages. In some implementations, each memory cell 807 is a multi-level cell (MLC) that is capable of storing more than a single bit of data in more than four memory states. For example, the MLC can store two bits per cell, three bits per cell (also known as triple-level cell (TLC)), or four bits per cell (also known as a quad-level cell (QLC)). Each MLC can be programmed to assume a range of possible nominal storage values. In one example, if each MLC stores two bits of data, then the MLC can be programmed to assume one of three possible programming levels from an erased state by writing one of three possible nominal storage values to the cell. A fourth nominal storage value can be used for the erased state.

As shown in FIG. 8, each NAND memory string 809 can include a source select transistor 811 at its source end and a drain select transistor 813 at its drain end. Source select transistor 811 and drain select transistor 813 can be configured to activate selected NAND memory strings 809 (columns of the array) during reading and programming operations. In some implementations, source select transistors 811 of NAND memory strings 809 in the same memory block are connected through a same source line 815, e.g., a common source line, for example, to ground. Drain select transistor 813 of each NAND memory string 809 is connected to a respective bit line 817 from which data can be read via an output bus (not shown), according to some implementations. In some implementations, each NAND memory string 809 is configured to be selected or deselected by applying a select voltage (e.g., above the threshold voltage of drain select transistor 813) or a deselect voltage (e.g., 0 V) to respective drain select transistor 813 while source select transistors 811 are connected to the common ground (i.e., 0 V).

Memory cells 807 of adjacent NAND memory strings 809 can be connected through word lines 819 that select which row of memory cells is affected by reading and programming operations. In some implementations, each word line 819 is connected to a page of memory cells (memory page 821), which is the smallest physically-addressable data unit for reading and programming operations. The size of memory page 821 in bits can correspond to the number of NAND memory strings 809 connected by word line 819. Each word line 819 can include a plurality of control gates at each memory cell 807 in respective memory page 821 and a gate line coupling the control gates.

As further shown in FIG. 8, peripheral circuit 805 can include any suitable digital, analog, and/or mixed-signal circuits used for facilitating the operations of 3D memory device 801. For example, peripheral circuit 805 can include one or more of a data buffer (e.g., a bit line page buffer), a decoder (e.g., a row decoder or a column decoder), a sense amplifier, a driver (e.g., a word line driver), a charge pump, a current or voltage reference, or any active or passive components of the circuits (e.g., transistors, diodes, resistors, or capacitors). In some implementations, peripheral circuit 805 is formed using CMOS technology.

In some implementations, peripheral circuit 805 includes a word line driving circuit 823 and a bit line driving circuit 825. Bit line driving circuit 825 can select or deselect NAND memory string 809 (and memory cells 807 thereof) by applying a select voltage or a deselect voltage to respective drain select transistor 813 via respective bit line 817 for various memory operations, such as programming of selected memory cells 807.

Word line driving circuit 823 can implement programming schemes for programming memory cells 807 in memory array device 803. The waveform of the programming scheme can be provided by peripheral circuit 805 to each memory page 821 through word lines 819 in the form of word line bias voltages $V_{WL}$. The word line bias voltages $V_{WL}$ that can be applied to word lines 819 include program voltage Vprogram, channel pass voltage Vpass, cut-off voltage Vcut, etc. In some implementations, the voltage regulator disclosed in the present disclosure (e.g., circuit 200 or 300) is part of word line driving circuit 823 for outputting a series of output voltages (e.g., vpass1, vpass 2 . . . vpassn) as the word line bias voltages $V_{WL}$ to word lines 819, respectively, using a smaller number of voltage regulators with large, dedicated op-amps to reduce the power consumption and the die area for peripheral circuit 805. It is understood that the implementation of the voltage regulators disclosed herein, however, is not limited to 3D NAND memory device and may include any suitable memory devices or other electronic devices that need voltage regulation with multiple voltage levels.

According to one aspect of the present disclosure, a voltage regulator can include an operational amplifier powered by a supply voltage and configured to generate a first gate voltage. The voltage regulator can also include a first transistor configured to receive the first gate voltage and generate a first driving voltage. The voltage regulator can further include a second transistor configured to receive a second gate voltage and generate a second driving voltage. The first gate voltage can be generated based on feedback provided to the operational amplifier. The second gate voltage can be generated from the first gate voltage.

In some implementations, the voltage regulator can further include a third transistor configured to receive a third gate voltage and generate a third driving voltage. The third gate voltage can be generated from the first gate voltage.

In some implementations, the voltage regulator can also include a first resistor pair connected to the first transistor between the first driving voltage and ground. The feedback can be provided from a central node of the first resistor pair to the operational amplifier.

In some implementations, the voltage regulator can further include a second resistor pair connected to the second transistor between the second driving voltage and ground. The second resistor pair can have a resistance matched to the first resistor pair.

In some implementations, the voltage regulator can additionally include a third resistor pair connected to the third transistor between the third driving voltage and ground. The third resistor pair can have a resistance matched to the first resistor pair and the second resistor pair.

In some implementations, the voltage regulator can also include a first current source connected to the second transistor between the second driving voltage and ground.

In some implementations, the voltage regulator can further include a second current source connected to the third transistor between the third driving voltage and ground.

In some implementations, the first current source and the second current source can include a single driving operational amplifier.

In some implementations, the single driving operational amplifier can be the operational amplifier.

In some implementations, the first current source and the second current source can include a PMOS current mirror and an NMOS current mirror.

In some implementations, the voltage regulator can also include a resistor network configured to generate the second gate voltage and/or the third gate voltage through the resistor network from the first gate voltage.

In some implementations, the resistor network can include a series of identical resistors. The second gate voltage can be drawn from between a first pair of the identical resistors, and the third gate voltage can be drawn from between a second pair of the identical resistors.

In some implementations, the resistor network can include a pair of current sources in series with the series of identical resistors and configured to provide current to the resistor network.

In some implementations, the series of identical resistors can be biased between the supply voltage and ground.

According to another aspect of the present disclosure, a method for voltage regulation can include generating a first gate voltage using power from a supply voltage. The method can also include generating a first driving voltage based on the first gate voltage. The method can further include generating a second driving voltage based on a second gate voltage. The first gate voltage can be generated based on feedback. The second gate voltage can be generated from the first gate voltage.

In some implementations, the method can additional include generating a third driving voltage based on a third gate voltage. The third gate voltage can be generated from the first gate voltage In some implementations, the method can also include generating the feedback using a first resistor pair connected between the first driving voltage and ground.

In some implementations, the method can further include generating a first current using a second resistor pair connected between the second driving voltage and ground.

In some implementations, the method can additionally include generating a second current using a third resistor pair connected between the third driving voltage and ground.

In some implementations, the method can also include generating a first current using a first current source connected between the second driving voltage and ground.

In some implementations, the method can further include generating a second current using a second current source connected between the third driving voltage and ground.

In some implementations, the generating the first current and the generating the second current can be performed by a same driving operational amplifier.

In some implementations, the same operational amplifier can further generate the first gate voltage.

In some implementations, the first current source and the second current source can each include a PMOS current mirror and an NMOS current mirror.

In some implementations, the method can include generating the second gate voltage and/or the third gate voltage from the first gate voltage, using a resistor network connected between the supply voltage and ground.

In some implementations, the resistor network can include a series of identical resistors. The method can further include drawing the second gate voltage from between a first pair of the identical resistors, and the third gate voltage from between a second pair of the identical resistors.

In some implementations, the method can further include providing the resistor network with current through a pair of current sources in series with the series of identical resistors.

In some implementations, the method can further include biasing the series of identical resistors between the supply voltage and ground.

According to another aspect of the present disclosure, a memory device can include an array of memory cells and a plurality of word lines connected to respective subsets of the array of memory cells. The memory device can also include a word line driving circuit connected to each of the plurality of word lines. The word line driving circuit can include an operational amplifier powered by a supply voltage and configured to generate a first gate voltage. The word line driving circuit can also include a first transistor configured to receive the first gate voltage and generate a first driving voltage. The word line driving circuit can further include a second transistor configured to receive a second gate voltage and generate a second driving voltage. The first gate voltage can be generated based on feedback provided to the operational amplifier. The second gate voltage. The first driving voltage can be configured to drive a first word line of the plurality of word lines. The second driving voltage can be configured to drive a second word line of the plurality of word lines.

In some embodiments, the word line driving circuit can further include a third transistor configured to receive a third gate voltage and generate a third driving voltage. The third gate voltage can be generated from the first gate voltage. The third driving voltage can be configured to drive a third word line of the plurality of word lines.

In some implementations, the memory device can also include a first resistor pair connected to the first transistor between the first driving voltage and ground. The feedback can be provided from a central node of the first resistor pair to the operational amplifier.

In some implementations, the memory device can further include a second resistor pair connected to the second transistor between the second driving voltage and ground. The second resistor pair can have a resistance matched to the first resistor pair.

In some implementations, the memory device can additionally include a third resistor pair connected to the third transistor between the third driving voltage and ground. The third resistor pair can have a resistance matched to the first resistor pair and the second resistor pair.

In some implementations, the memory device can also include a first current source connected to the second transistor between the second driving voltage and ground.

In some implementations, the memory device can further include a second current source connected to the third transistor between the third driving voltage and ground.

In some implementations, the first current source and the second current source can include a single driving operational amplifier.

In some implementations, the single driving operational amplifier can be the operational amplifier.

In some implementations, the first current source and the second current source can include a PMOS current mirror and an NMOS current mirror.

In some implementations, the memory device can also include a resistor network configured to generate the second gate voltage and/or the third gate voltage through the resistor network from the first gate voltage.

In some implementations, the resistor network can include a series of identical resistors. The second gate voltage can be drawn from between a first pair of the identical resistors, and the third gate voltage can be drawn from between a second pair of the identical resistors.

In some implementations, the resistor network can include a pair of current sources in series with the series of identical resistors and configured to provide current to the resistor network.

In some implementations, the series of identical resistors can be connected between the supply voltage and ground.

The foregoing description of the specific implementations can be readily modified and/or adapted for various applications. Therefore, such adaptations and modifications are intended to be within the meaning and range of equivalents of the disclosed implementations, based on the teaching and guidance presented herein.

The breadth and scope of the present disclosure should not be limited by any of the above-described exemplary implementations, but should be defined only in accordance with the following claims and their equivalents.

What is claimed is:

1. A voltage regulator, comprising:
an operational amplifier;
a first transistor comprising a gate terminal coupled to an output terminal of the operational amplifier, wherein a first terminal of the first transistor is coupled to a power supply terminal of the operational amplifier;
a voltage divider coupled to an input terminal of the operational amplifier and a second terminal of the first transistor; and
at least one second transistor, wherein a gate terminal of each of the at least one second transistor is coupled to the gate terminal of the first transistor by a respective number of resistors.

2. The voltage regulator of claim 1, wherein a first gate voltage of the first transistor is different from a second gate voltage of each of the at least one second transistor.

3. The voltage regulator of claim 2, wherein the at least one second transistor comprises a plurality of second transistors, and the second gate voltage of each of the plurality of second transistors is different from each other.

4. The voltage regulator of claim 1, wherein the voltage divider comprises a first resistor and a second resistor, and the input terminal of the operational amplifier is connected between the first resistor and the second resistor.

5. The voltage regulator of claim 4, further comprising at least one resistor pair each comprising a third resistor and a fourth resistor, wherein a first terminal of each of the at least one second transistor is connected with the power supply terminal of the operational amplifier, and a second terminal of each of the at least one second transistor is connected with one resistor pair respectively.

6. The voltage regulator of claim 4, further comprising at least one first current source each connected between a respective one of the at least one second transistor and ground.

7. The voltage regulator of claim 6, further comprising a P-channel metal oxide semiconductor (PMOS) current mirror connected between the power supply terminal of the operational amplifier and the first terminal of the first transistor.

8. The voltage regulator of claim 7, further comprising:
at least one third transistor each connected to a respective one of the at least one second transistor; and
a fourth transistor connected between the PMOS current mirror and a gate terminal of one third transistor, wherein the fourth transistor and each of the at least one third transistor correspond to a N-channel metal oxide semiconductor (NMOS) current mirror, respectively.

9. The voltage regulator of claim 1, further comprising a resistor network, wherein the resistor network comprises a series of resistors, the gate terminal of the first transistor is connected with a first node of the resistor network, a gate terminal of each of the at least one second transistor is connected with a second node of the resistor network respectively, and the respective number of resistors is connected between the first node and a respective second node.

10. The voltage regulator of claim 9, wherein the resistor network further comprises a pair of current sources in series with the series of resistors and is configured to provide current to the resistor network.

11. The voltage regulator of claim 10, wherein the pair of current sources comprise a second current source and a third current source, the second current source is connected between the power supply terminal of the operational amplifier and the series of resistors, and the third current source is connected between the series of resistors and ground.

12. A voltage regulator, comprising:
an operational amplifier, an output terminal of the operational amplifier is configured to apply a first gate voltage;
a first transistor coupled to the output terminal of the operational amplifier, wherein the first transistor is configured to receive the first gate voltage and output a first driving voltage; and
at least one second transistor coupled to the first transistor, wherein each of the at least one second transistor is configured to output a second driving voltage respectively, and each second driving voltage is different from the first driving voltage.

13. The voltage regulator of claim 12, further comprising a voltage divider comprising a first resistor and a second resistor, wherein a first terminal of the first transistor is connected with a power supply terminal of the operational amplifier, a second terminal of the first transistor is connected with the first resistor, and an input terminal of the operational amplifier is connected between the first resistor and the second resister; and wherein a first node between the second terminal of the first transistor and the first resistor is configured to output the first driving voltage.

14. The voltage regulator of claim 13, further comprising at least one resistor pair each comprising a third resistor and a fourth resistor, wherein a first terminal of each of the at least one second transistor is connected with the power supply terminal of the operational amplifier, a second terminal of each of the at least one second transistor is connected with one resistor pair; and wherein a second node between the second terminal of each of the at least one second transistor and the respective resistor pair is configured to output the second driving voltage.

15. The voltage regulator of claim 14, further comprising a series of resistors, wherein a respective number of resistors of the series of resistors is connected between a gate terminal of the first transistor and a gate terminal of each of the at least one second transistor; and wherein a first gate voltage of the first transistor is different from a second gate voltage of each of the at least one second transistor.

16. The voltage regulator of claim 15, wherein the at least one second transistor comprises a plurality of second transistors, wherein the second gate voltage of each of the plurality of second transistors is different from each other.

17. A memory device, comprising:
an array of memory cells;
word lines coupled to the array of memory cells; and
a peripheral circuit coupled to the word lines, wherein the peripheral circuit comprises:
an operational amplifier;
a first transistor comprising a gate terminal coupled to an output terminal of the operational amplifier, wherein a first terminal of the first transistor is coupled to a power supply terminal of the operational amplifier;
a voltage divider coupled to an input terminal of the operational amplifier and a second terminal of the first transistor; and
at least one second transistor, wherein a gate terminal of each second transistor is coupled to the gate terminal of the first transistor by a respective number of resistors,
wherein the second terminal of the first transistor and a first terminal of each of the at least one second transistor are coupled to one of the word lines respectively, and a second terminal of each of the at least one second transistor is coupled to the power supply terminal of the operational amplifier.

18. The memory device of claim 17, wherein the first transistor is configured to output a first driving voltage to a respective first word line of the word lines, each of the at least one second transistor is configured to output a second driving voltage to a respective second word line of the word lines, and each second driving voltage is different from the first driving voltage.

19. The memory device of claim 18, wherein each second driving voltage is different from each other.

20. The memory device of claim 17, further comprising a resistor network, wherein the resistor network comprises a series of resistors, the gate terminal of the first transistor is connected with a first node of the resistor network, the gate terminal of each of the at least one second transistor is connected with a second node of the resistor network, and the respective number of resistors is connected between the first node and each second node.

* * * * *